(12) United States Patent
Chuang et al.

(10) Patent No.: US 11,291,112 B2
(45) Date of Patent: Mar. 29, 2022

(54) METHOD FOR MANUFACTURING FLEXIBLE PANEL

(71) Applicant: HannStar Display Corporation, Taipei (TW)

(72) Inventors: Yao-Chih Chuang, Tainan (TW); Mei-Ling Chou, Tainan (TW); Chih-Wei Chen, Tainan (TW); Ming-Chang Yu, Taichung (TW); Chia-Yu Liu, Tainan (TW); Yen-Chung Chen, Taichung (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 17/102,371

(22) Filed: Nov. 23, 2020

(65) Prior Publication Data
US 2021/0204393 A1 Jul. 1, 2021

(30) Foreign Application Priority Data
Dec. 31, 2019 (CN) .......................... 201911417108.X

(51) Int. Cl.
*H05K 1/02* (2006.01)
*G06F 3/041* (2006.01)
*H05K 1/18* (2006.01)

(52) U.S. Cl.
CPC ........... *H05K 1/028* (2013.01); *G06F 3/0412* (2013.01); *H05K 1/189* (2013.01); *H05K 2201/10128* (2013.01)

(58) Field of Classification Search
CPC ...................................................... G09G 9/301
See application file for complete search history.

(56) References Cited

U.S. PATENT DOCUMENTS

| | | | | |
|---|---|---|---|---|
| 2010/0319840 A1* | 12/2010 | Sadlier | .................... | B65D 65/10 156/212 |
| 2015/0333221 A1* | 11/2015 | Bibl | ........................ | G09F 9/301 257/88 |
| 2015/0366113 A1* | 12/2015 | Sreetharan | .......... | E05D 11/0081 16/225 |
| 2016/0014909 A1* | 1/2016 | Faraci | ...................... | H05K 3/00 156/64 |
| 2017/0303985 A1* | 10/2017 | Park | ......................... | H05K 3/12 |
| 2018/0139841 A1* | 5/2018 | Hu | ............................ | H05K 3/22 |
| 2019/0073505 A1 | 3/2019 | Kwon et al. | | |
| 2020/0305289 A1* | 9/2020 | Yu | ........................ | H05K 3/4682 |

FOREIGN PATENT DOCUMENTS

| | | |
|---|---|---|
| CN | 108321176 | 7/2018 |
| CN | 109459879 | 3/2019 |

* cited by examiner

*Primary Examiner* — Fred Tzeng
(74) *Attorney, Agent, or Firm* — JCIPRNET

(57) ABSTRACT

A method for manufacturing a flexible panel is provided, and the method includes following steps. A column is formed on a carrier substrate. A flexible layer is formed on the carrier substrate, where at least a part of a side surface of the column is surrounded by the flexible layer, so as to form a through hole in the flexible layer. A component layer is formed on the flexible layer, and the column and the carrier substrate are removed. No chars, cracks, and cutting marks are formed on an edge of the through hole of the flexible panel.

18 Claims, 10 Drawing Sheets

METHOD FOR MANUFACTURING FLEXIBLE PANEL

CROSS-REFERENCE TO RELATED APPLICATION

This application claims the priority benefit of China patent application Ser. No. 201911417108.X, filed on Dec. 31, 2019. The entirety of the above-mentioned patent application is hereby incorporated by reference herein and made a part of this specification.

BACKGROUND

Technical Field

The invention relates to a method for manufacturing a flexible panel.

Description of Related Art

Generally, a hole is formed at a region on the workpiece where the hole is intended to be formed through laser irradiation or cutter wheel cutting. However, redundant laser energy easily leads to thermal effects, which causes damages to an edge of the region where the hole is formed. For example, there are side effects such as chars or cracks formed on an edge of a formed through hole. In addition, the cutter wheel cutting operation may also leave cutting marks on a cross section of the through hole, which affects precision and quality of a molded product.

SUMMARY

The invention is directed to a method for manufacturing a flexible panel, so that no chars, cracks, or cutting marks are formed on an edge of a through hole of the flexible panel.

According to an embodiment of the invention, a method for manufacturing a flexible panel includes following steps. A column is formed on a carrier substrate. A flexible layer is formed on the carrier substrate, where at least a part of a side surface of the column is surrounded by the flexible layer, and a through hole in the flexible layer. A component layer is formed on the flexible layer, and the column and the carrier substrate are removed.

In an embodiment of the invention, before the step of forming the flexible layer on the carrier substrate, the method further includes a step of forming a release layer on the carrier substrate.

In an embodiment of the invention, the step of forming the release layer on the carrier substrate is performed before the step of forming the column on the carrier substrate, and the column is located on the release layer after the step of forming the column on the carrier substrate is performed.

In an embodiment of the invention, the column penetrates the flexible layer after the step of forming the flexible layer on the carrier substrate is performed.

In an embodiment of the invention, a region of flexible layer penetrated by the column is the through hole.

In an embodiment of the invention, a height of the column is greater than or equal to a height of the flexible layer in a direction perpendicular to the carrier substrate.

In an embodiment of the invention, the height of the column is greater than the height of the flexible layer, and the difference between the height of the column and the height of the flexible layer is greater than or equal to 1 micrometer and less than or equal to 10 micrometers.

In an embodiment of the invention, the step of forming the release layer on the carrier substrate is performed after the step of forming the column on the carrier substrate, and the release layer covers the column after the step of forming the release layer on the carrier substrate is performed.

In an embodiment of the invention, the column and a part of the release layer penetrate the flexible layer after the step of forming the flexible layer on the carrier substrate is performed.

In an embodiment of the invention, a region of flexible layer penetrated by the column and the part of the release layer is the through hole.

In an embodiment of the invention, a height of a top surface of the release layer located above a top surface of the column is equal to higher than a height of a top surface of the flexible layer in a direction perpendicular to the carrier substrate.

In an embodiment of the invention, the height of the top surface of the release layer is higher than the height of the top surface of the flexible layer, and the difference therebetween is greater than or equal to 1 micrometer and less than or equal to 10 micrometers.

In an embodiment of the invention, the step of removing the column and the carrier substrate further includes removing the release layer.

In an embodiment of the invention, an adhesive force between the flexible layer and the carrier substrate is greater than an adhesive force between the flexible layer and the release layer.

In an embodiment of the invention, after the step of forming the component layer on the flexible layer and before the step of removing the column and the carrier substrate, the method further includes a step of forming a functional layer on the component layer, wherein an adhesive force between the functional layer and the component layer is greater than an adhesive force between the flexible layer and the release layer.

In an embodiment of the invention, the functional layer a protective film or an ultraviolet (UV) film.

In an embodiment of the invention, the step of forming the flexible layer on the carrier substrate includes forming a flexible material layer on the carrier substrate and performing a heat treatment process on the flexible material layer.

In an embodiment of the invention, the component layer includes a touch component layer or a display component layer.

In an embodiment of the invention, the flexible layer has a first surface and a second surface that are opposite to each other, the second surface is in contact with the component layer, and after the step of removing the column and the carrier substrate, the method further includes a step of forming a protective layer on the first surface of the flexible layer.

In an embodiment of the invention, a material of the column includes photoresist.

Based on the above, the through hole of the flexible layer in the flexible panel as provided in one or more embodiments of the invention is formed through the following steps. The column is formed before forming the flexible layer, so that the flexible layer may surround the column, and then the column is removed to form a through hole having a shape similar to the column. No chars, cracks, or cutting marks are formed on the through hole, and the resultant through hole has a smooth cross section.

BRIEF DESCRIPTION OF THE DRAWINGS

The accompanying drawings are included to provide a further understanding of the invention, and are incorporated in and constitute a part of this specification. The accompanying drawings illustrate embodiments of the invention and, together with the description, serve to explain the principles of the invention.

DESCRIPTION OF THE EMBODIMENTS

The exemplary embodiments of the invention are described in detail, and examples of the exemplary embodiments are illustrated in the accompanying drawings. Wherever possible, the same component symbols are used in the accompanying drawings and descriptions to represent the same or similar parts. The invention may also be implemented in various different forms, but shall not be limited to the embodiments described in this specification. Thicknesses of layers and regions in the accompanying drawings may be amplified for clarity. The same or similar reference numbers represent same or similar components. This is not described again in detail in the following paragraphs. In addition, the directional terms mentioned in the embodiments, such as "above", "below", "left", "right", "front", and "back", are only the directions in the accompanying drawings. Therefore, the used directional terms are only used for illustration instead of limiting the invention.

Figure 1A:
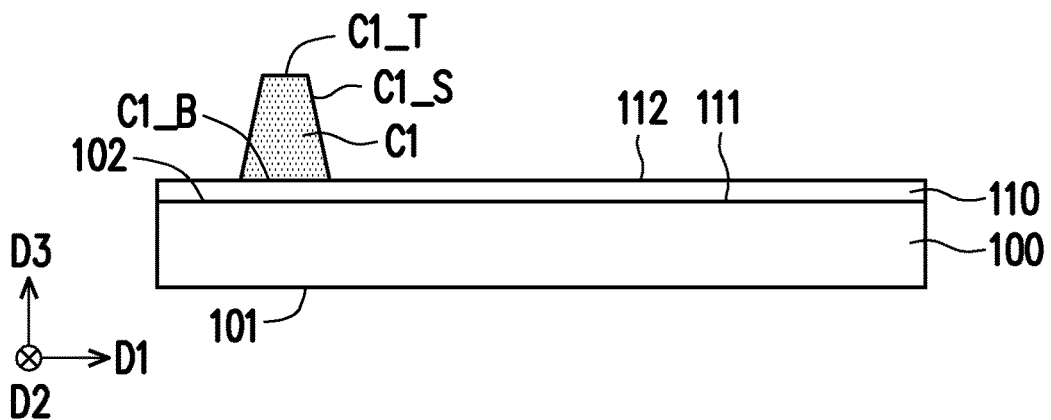
FIG. 1A to FIG. 1G schematically illustrate some steps of manufacturing a flexible panel according to a first embodiment of the invention.
Figure 1B:
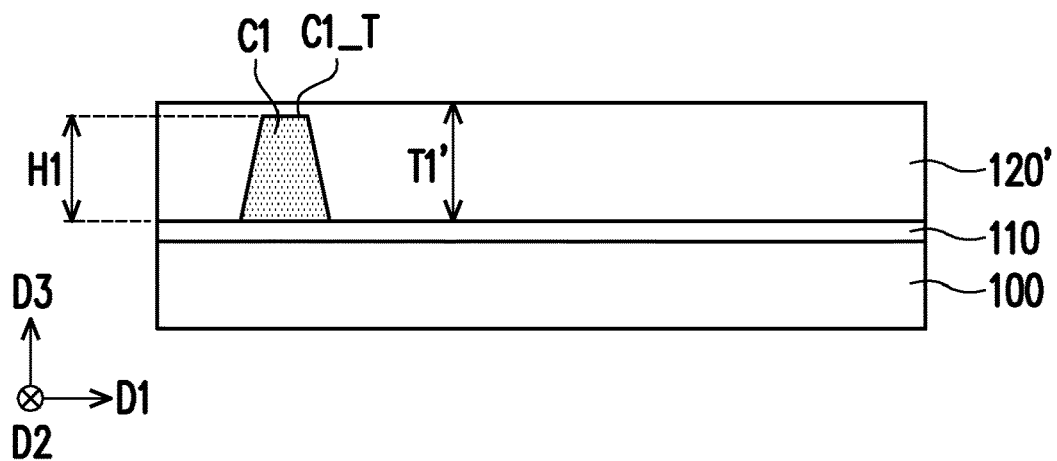
Figure 1C:
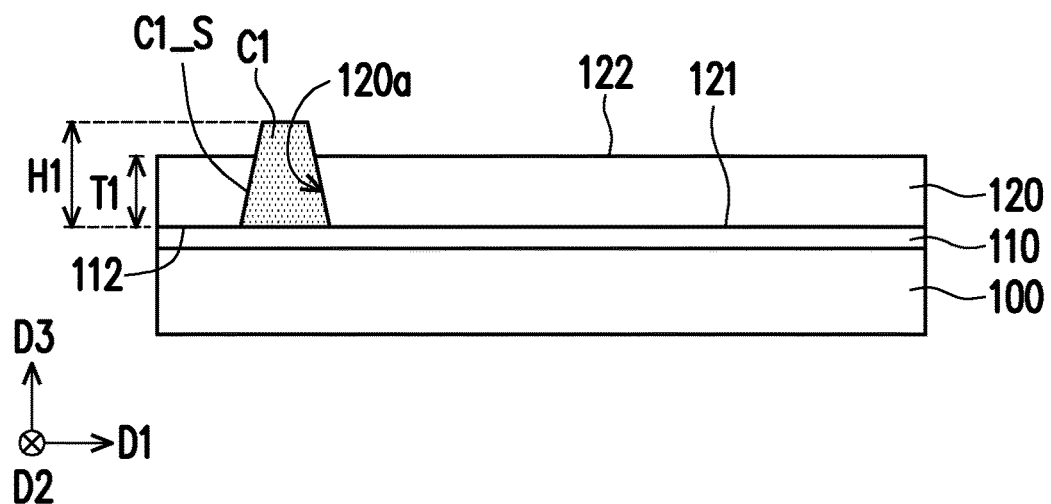
Figure 1D:
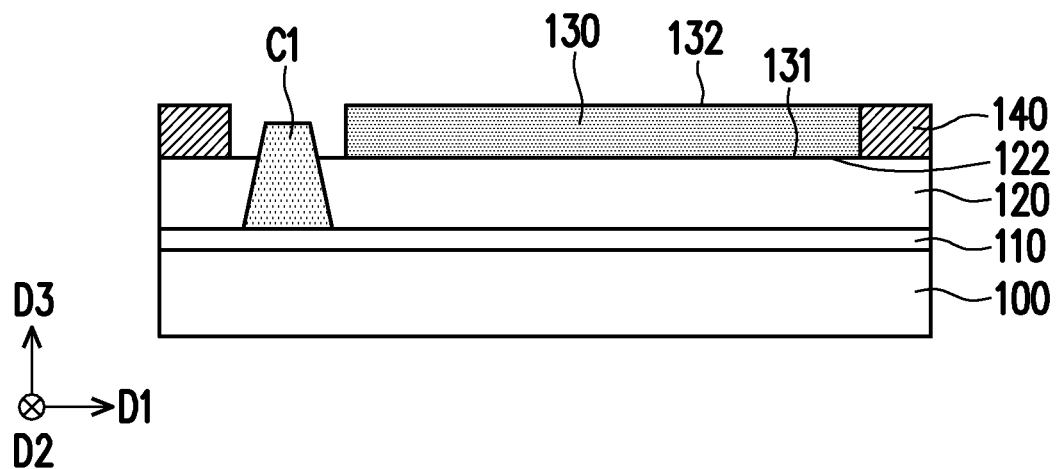
Figure 1E:
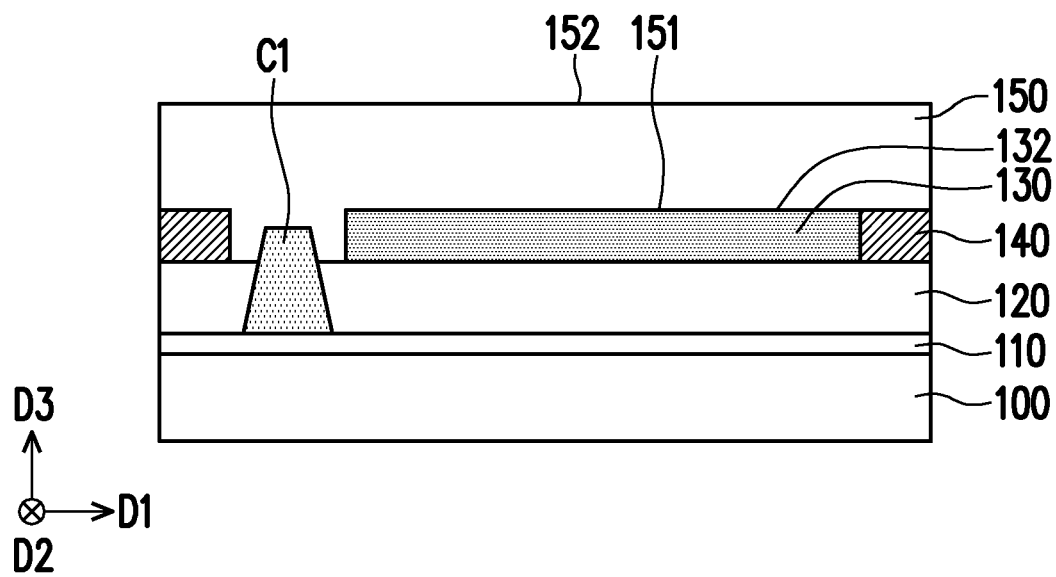
Figure 1F:
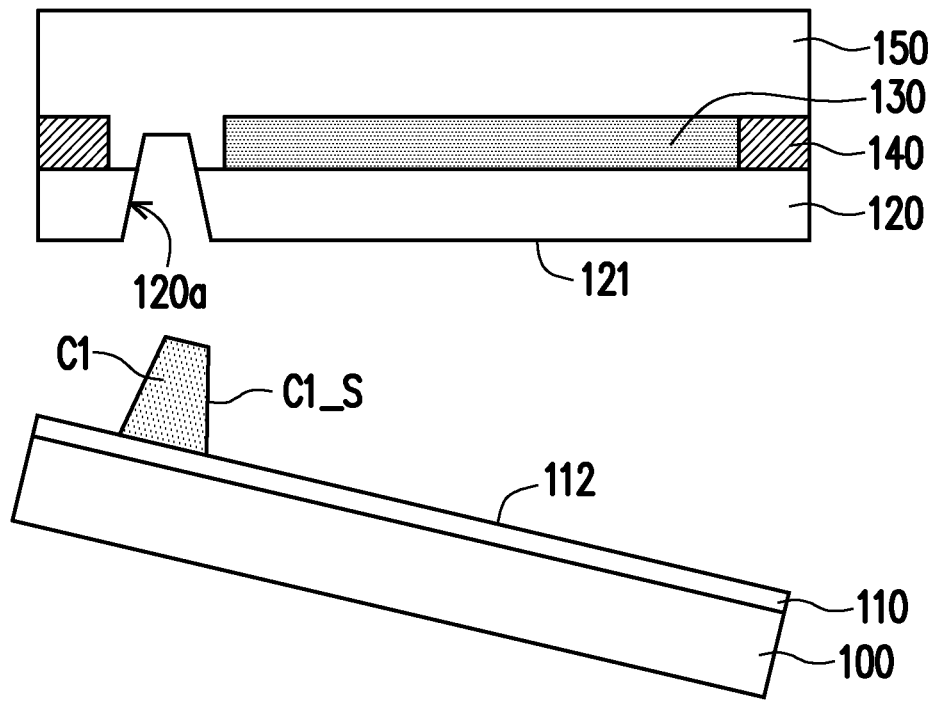
Figure 1G:
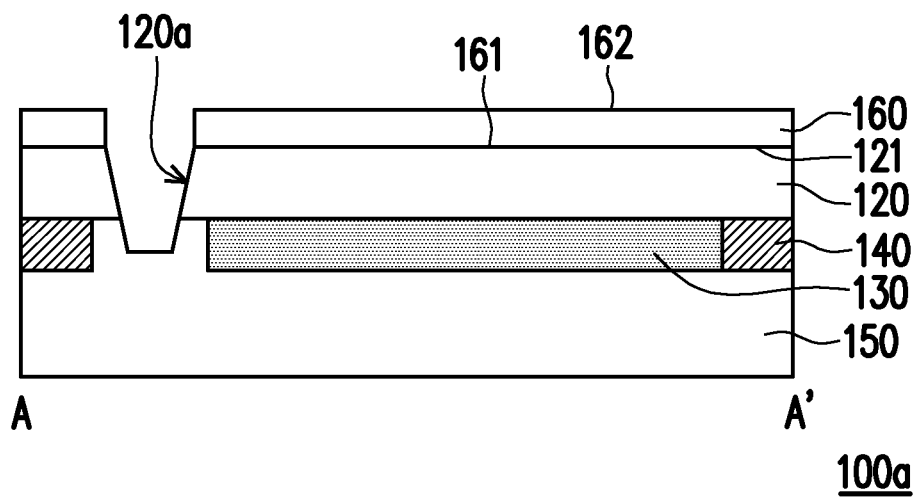
Figure 2:
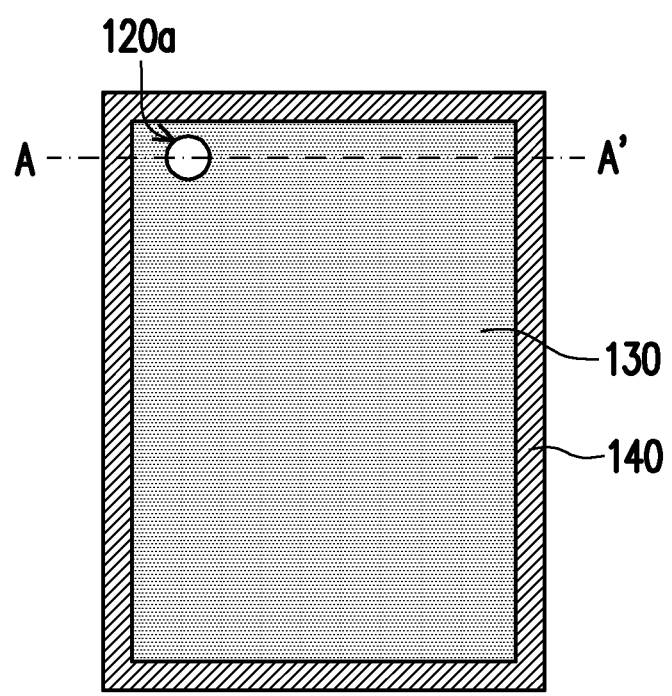
FIG. 2 is a schematic top view of the flexible panel according to the first embodiment of the invention.

FIG. 1A to FIG. 1G schematically illustrate some steps of manufacturing a flexible panel according to a first embodiment of the invention, and FIG. 2 is a schematic top view of the flexible panel according to the first embodiment of the invention.

Referring to FIG. 1A, a release layer 110 is formed on a carrier substrate 100. The carrier substrate 100 has two opposite surfaces 101 and 102. The release layer 110 has two opposite surfaces 111 and 112. The surface 111 of the release layer 110 and the surface 102 of the carrier substrate 100 are opposite to each other. Next, a column C1 is formed on the surface 112 of the release layer 110. The column C1 has a top surface C1_T, a bottom surface C1_B, and a side surface C1_S. The carrier substrate 100 may be, for example, a rigid substrate. The rigid substrate is not easy to deform due to an effect of an external force during a manufacturing process, so as to provide the release layer 110 disposed on the carrier substrate 100 and the column C1 with good flatness, and provide a film disposed on the carrier substrate 100 subsequently with good stability. A material of the carrier substrate 100 may be, for example, glass, polycarbonate, stainless steel, or a combination thereof, but the invention is not limited thereto. In the present embodiment, an area of the top surface C1_T of the column C1 is less than that of the bottom surface C1_B. As shown in FIG. 1A, a cross-sectional area of the column C1 decreases in a normal direction away from the carrier substrate 100. That is, a cross-sectional area of the column C1 on a plane D1-D2 decreases in a direction D3, but the invention is not limited thereto. In the present embodiment, a direction D1 is perpendicular to a direction D2, and the direction D3 is perpendicular to the plane D1-D2 and the surface 102 of the carrier substrate 100, but the invention is not limited thereto. For example, the column C1 may be cone-shaped, but the invention is not limited thereto.

Referring to FIG. 1B, a flexible material layer 120' is formed on the release layer 110. In the present embodiment, the flexible material layer 120' covers the column C1 located on the carrier substrate 100. That is, a thickness T1' of the flexible material layer 120' may be greater than a height H1 of the column C1, but the invention is not limited thereto. In some other embodiments, the thickness T1' of the flexible material layer 120' may be equal to or less than the height H1 of the column C1. A forming method of the flexible material layer 120' may be, for example, a slit coating method, a spin-coating method, or a combination thereof, but the invention is not limited thereto. Materials of the flexible material layer 120' may include, for example, polyimide, polyethylene naphthalate (PEN), polyethylene terephthalate (PET), or a combination of at least two of the foregoing materials, or may include a precursor of one of the foregoing materials or a combination of precursors of at least two of the foregoing materials, but the invention is not limited thereto. In the present embodiment, the material of the flexible material layer 120' includes polyimide. In addition, in the present embodiment, the flexible material layer 120' may further include a solvent. Therefore, the flexible material layer 120' formed in steps of FIG. 1B is in a wet film state, but the invention is not limited thereto. For example, the flexible material layer 120' may include polyimide and a solvent, or include a precursor polyamic acid of polyimide and a solvent, and the heat treatment process described below may be performed on the polyamic acid to form polyimide.

Referring to FIG. 1C, a flexible layer 120 is formed on the carrier substrate 100. The flexible layer 120 is disposed on the surface 112 of the release layer 110, and surrounds a part of the side surface C1_S of the column C1. The flexible layer 120 has two opposite surfaces 121 and 122. The surface 121 of the flexible layer 120 and the surface 112 of the release layer 110 are opposite to each other. In the present embodiment, the flexible layer 120 is in contact with the surface 112 of the release layer 110 and the part of the side surface C1_S of the column C1, but the invention is not limited thereto. A method for forming the flexible layer 120 is, for example, performing a heat treatment process on the flexible material layer 120', so as to convert the flexible material layer 120' into the flexible layer 120. For example, a vacuum dry machine and a hot plate may be used to pre-bake the flexible material layer 120'. Alternatively, a hot vacuum dry stove may be used to pre-bake the flexible material layer 120'. Then, for example, the pre-baked flexible material layer 120' is hard-baked by using an oven, but the heat treatment process in the invention is not limited thereto. The heat treatment process may remove at least a part of the solvent in the flexible material layer 120'. In addition, in an embodiment in which the flexible material layer 120' includes precursors, the heat treatment process may convert the precursors into materials of the flexible layer 120. After the heat treatment process is performed, the solvent in the flexible material layer 120' has been volatilized. Therefore, a thickness T1 of the flexible layer 120 is less than the thickness T1' of the flexible material layer 120', and the thickness T1 of the flexible layer 120 is less than the height H1 of the column C1. In the present embodiment, the thickness T1 of the flexible layer 120 is a distance between the two surfaces 121 and 122 of the flexible layer 120 in the direction D3. The thickness T1 of the flexible layer 120 may be 5 micrometers to 80 micrometers, but the invention is not limited thereto. The flexible layer 120 may, for example, surround the column C1, and a region occupied by the column C1 in the flexible layer 120 is a through hole 120a of the flexible layer 120. In the invention, after the flexible layer 120 is formed, the column C1 is surrounded by the flexible layer 120, and the thickness T1 of the flexible layer 120 is less than the height H1 of the column C1. Therefore, the column C1 may penetrate the flexible layer 120 to form the through hole 120a in the flexible layer 120. In the present embodiment, the cross-sectional area of the column C1 on the plane D1-D2 decreases in the normal direction D3 away from the carrier substrate 100, so that a cross-sectional area, on the plane D1-D2, of the through hole 120a also decreases in the normal direction D3 from the carrier substrate 100. In the present embodiment, preferably, the thickness T1 of the flexible layer 120 is less than the height H1 of the column C1, and preferably, a difference between the height H1 of the column C1 and the thickness T1 of the flexible layer 120 is 1 micrometer to 10 micrometers, that is, 1 micrometer≤H1−T1≤10 micrometers, so as to separate the flexible layer 120 from the column C1 more easily in subsequent steps, but the invention is not limited thereto. For example, when the thickness T1 of the flexible layer 120 is 10 micrometers, the height H1 of the column C1 may be greater than or equal to 11 micrometers and less than or equal to 20 micrometers. In addition, the flexible material layer 120' includes a solvent, and the percentage of the solvent in the flexible material layer 120' is usually relatively large. For example, the solvent and the polyimide (or a precursor polyamic acid of the polyimide) in the flexible material layer 120' may respectively account for approximately 90% and approximately 10%. Therefore, preferably, the thickness T1' of the flexible material layer 120' is greater than the height H1 of the column C1, so that the thickness T1 of the flexible layer 120 formed through the heat treatment process (that is, after the solvent is volatilized) may not be excessively thin, but the invention is not limited thereto. For example, the thickness T1 of the flexible layer 120 may be 5 micrometers to 80 micrometers, and the height H1 of the column C1 is approximately 1 micrometer to 10 micrometers greater than the thickness T1 of the flexible layer 120. Therefore, the thickness T1' of the flexible material layer 120' is usually greater than the height H1 of the column C1. In other embodiments, the thickness T1 of the flexible layer 120 may be equal to the height H1 of the column C1, and the column C1 is surrounded by the flexible layer 120, so that the column C1 may also penetrate the flexible layer 120 to form the through hole 120a in the flexible layer 120. Therefore, a region of the flexible substrate 120 penetrated by the column C1 is the through hole 120a in the invention. Based on the above, the flexible layer 120 surrounds at least a part of the side surface C1_S of the column C1, and the thickness T1 of the flexible layer 120 is less than or equal to the height H1 of the column C1, so that the column C1 penetrates the flexible layer 120 to form the through hole 120a in the flexible layer 120.

It should be noted that in the present embodiment, the flexible material layer 120' includes the solvent. Therefore, the heat treatment process needs to be performed on the flexible material layer 120' in FIG. 1B to remove the solvent, so as to form the flexible layer 120 in FIG. 1C, and the thickness T1 of the flexible layer 120 is less than the thickness T1' of the flexible material layer 120', but the invention is not limited thereto. In other embodiments, the thickness of the flexible layer 120 may be equal to the thickness of the flexible material layer 120', and the thickness of the flexible material layer 120' is less than or equal to the height H1 of the column C1. For example, in some embodiments, the flexible material layer 120' may not include a solvent. The flexible material layer 120' is converted into the flexible layer 120 through a process, and the thickness of the flexible layer 120 is equal to the thickness of the flexible material layer 120'. In some other embodiments, after the steps in FIG. 1A, the flexible layer 120 may be directly formed on the release layer 110 instead of first forming the flexible material layer 120' as shown in FIG. 1B, and then converting the flexible material layer 120' into the flexible layer 120 shown in FIG. 1C.

Referring to FIG. 1D, a component layer 130 is formed on the flexible layer 120. The component layer 130 has two opposite surfaces 131 and 132. The surface 131 of the component layer 130 and the surface 122 of the flexible layer 120 are opposite to each other. In the present embodiment, the flexible panel is a flexible touch panel, and the component layer 130 is a touch component layer, but the invention is not limited thereto. In some other embodiments, the flexible panel is a flexible display panel, and the component layer 130 is a display component layer. The component layer 130 in the present embodiment may include, for example, touch electrodes, and the flexible panel may be, for example, a self-capacitive flexible touch panel or a mutual-capacitive flexible touch panel. For example, the touch electrodes may include a touch driving electrode and a touch sensing electrode, and the touch driving electrode and the touch sensing electrode may be, for example, located at different layers or at a same layer, but the invention is not limited thereto. The component layer 130 may be a multi-layer structure. For example, the component layer 130 may include at least a conductive layer and at least an insulating layer, but the invention is not limited thereto. In other embodiments, the component layer 130 may be a single-layer structure and include a conductive layer. In addition, in the present embodiment, the method further includes: forming a light shielding layer 140 on the flexible layer 120. The flexible panel has an active region and a peripheral region. The touch electrodes in the component layer 130 are disposed in the active region, and the light shielding layer 140 is disposed in the peripheral region to cover components (for example, wirings) in the peripheral region. For example, a plurality of wirings are disposed in a peripheral region of a flexible touch panel to, for example, be respectively electrically connected to the touch electrodes. The light shielding layer 140 may cover the wirings in the peripheral region, so that the wirings are not observed by a user. A material of the light shielding layer 140 may be, for example, black photoresist, a black pigment, or metal, but the invention is not limited thereto. It should be noted that, the component layer 130 is not drawn between the light shielding layer 140 and the flexible layer 120 in FIG. 1D, but the invention is not limited thereto. In other embodiments, a part of the component layer 130 may be disposed between the light shielding layer 140 and the flexible layer 120. In addition, a forming sequence of the component layer 130 and the light shielding layer 140 is not limited in the invention. For example, the forming sequence may be: forming the component layer 130 and then forming the light shielding layer 140, forming the light shielding layer 140 and then forming the component layer 130, or forming a part of the component layer 130, then forming the light shielding layer 140, and next forming the other part of the component layer 130.

Referring to FIG. 1E, a functional layer 150 is disposed on the component layer 130. The functional layer 150 has two opposite surfaces 151 and 152. The surface 151 of the functional layer 150 and the surface 132 of the component layer 130 are opposite to each other. The functional layer 150 may be disposed on the component layer 130, for example, by using a laminating process, but the invention is not limited thereto. The functional layer 150 may be a protective film or an ultraviolet (UV) film. The functional layer 150 may prevent the flexible layer 120 from being broken in a lift-off process in a next step (referring to FIG. 1F), and after the flexible layer 120 is separated from the column C1 and the surfaces of the release layer 110, the functional layer 150 is used for supporting the flexible layer 120, the component layer 130, and the light shielding layer 140.

Referring to FIG. 1F, the carrier substrate 100, the release layer 110, and the column C1 are removed. The flexible layer 120 is separated from the side surface C1_S of the column C1 and the surface 112 of the release layer 110, so as to remove the carrier substrate 100, the release layer 110, and the column C1. In addition, structures of the flexible layer 120, the component layer 130, the light shielding layer 140, and the functional layer 150 are retained. A method for removing the carrier substrate 100, the release layer 110, and the column C1 may be achieved, for example, by performing a laser lift-off process or a mechanical lift-off process. For example, the flexible layer 120 may be separated from the side surface C1_S of the column C1 and the surface 112 of the release layer 110 through a mechanical lift-off process. In addition, in some embodiments, heating or soaking may be performed before the mechanical lift-off process is performed, so as to reduce an adhesive force between the flexible layer 120 and the column C1 and/or an adhesive force between the flexible layer 120 and the release layer 110, but the invention is not limited thereto. In an embodiment in which the carrier substrate 100, the release layer 110, and the column C1 are removed though a laser lift-off process, before the lift-off process is performed, a laser may be irradiated in a direction from the carrier substrate 100 toward the flexible layer 120, for example, a laser is irradiated in the direction D3, so as to reduce the adhesive force between the flexible layer 120 and the column C1 and/or the adhesive force between the flexible layer 120 and the release layer 110. The lift-off process is performed next to remove the carrier substrate 100, the release layer 110, and the column C1. Particularly, an adhesive force between the functional layer 150 and the component layer 130 may be greater than the adhesive force between the flexible layer 120 and the column C1 and the adhesive force between the flexible layer 120 and the release layer 110 in the lift-off process, so that the flexible layer 120 may be separated from the surfaces of the column C1 and the release layer 110, but the invention is not limited thereto. It should be noted that in some embodiments, the steps in FIG. 1E may not be performed. That is, the functional layer 150 is not disposed, and after the steps in FIG. 1D are performed, steps similar to those in FIG. 1F are performed to remove the carrier substrate 100, the release layer 110, and the column C1, but the invention is not limited thereto.

As shown in FIG. 1A to FIG. 1F, the through hole 120a may be formed in the flexible layer 120 by the column C1 penetrating the flexible layer 120. In addition, the columns C1 in FIG. 1C to FIG. 1E are in contact with the flexible layer 120, and in FIG. 1F, the column C1 is separated from the flexible layer 120. Therefore, to enable the flexible layer 120 to be easily peeled off from the surface of the column C1 in the steps in FIG. 1F, a material of the column C1 needs to be a material that is easily stripped from the flexible layer 120 in the lift-off process. For example, the material of the column C1 may be an organic material including silicon, an organic material including fluorine, an inorganic material including silicon dioxide, or a combination of the materials described above, but the invention is not limited thereto. Selection of the material of the column C1, for example, depends on a material of the flexible layer 120. That is, a material enabling the flexible layer 120 to be easily peeled off from the side surface C1_S of the column C1 may be selected. In addition, as shown in FIG. 1E and FIG. 1F, the release layer 110 and the column C1 may be peeled off from the surface of the flexible layer 120 in the step of FIG. 1F. Therefore, the release layer 110 may include, for example, a material same as or similar to that of the column C1, but the invention is not limited thereto. For example, the material of the release layer 110 may be an organic material including silicon, an organic material including fluorine, an inorganic material including silicon dioxide, or a combination of the materials described above, but the invention is not limited thereto. It should be noted that in some embodiments, when the material of the release layer 110 is completely the same as that of the column C1, the release layer 110 and the column C1 may be formed in a process step at the same time. For example, a material layer may be formed on the carrier substrate 100, and then a part of the material layer is removed outside a region in which the column C1 is to be formed, so that a thickness of the material layer located at the region in which the column C1 is to be formed is greater than that of the material layer located at other regions, so as to form the column C1 and the release layer 110. In addition, it should be noted that the release layer 110 is used for separating the carrier substrate 100 from the flexible layer 120 more easily in this embodiment, therefore, an adhesive force between the release layer 110 and the flexible layer 120 is less than an adhesive force between the carrier substrate 100 and the flexible layer 120 in this embodiment. In other embodiments, for example, in an embodiment in which the flexible layer 120 is easily peeled off from a surface of the carrier substrate 100, the release layer 110 may be selectively not disposed between the carrier substrate 100 and the flexible layer 120.

Referring to FIG. 1G, a protective layer 160 is formed on the surface 121 of the flexible layer 120 back to the component layer 130. The protective layer 160 has two opposite surfaces 161 and 162. The surface 161 of the protective layer 160 and the surface 121 of the flexible layer 120 are opposite to each other. For example, after the carrier substrate 100, the release layer 110, and the column C1 are removed, structures of the flexible layer 120, the component layer 130, the light shielding layer 140, and the functional layer 150 are flipped, so that the surface 121 of the flexible layer 120 is upward, so as to form the protective layer 160 on the surface 121 of the flexible layer 120, but the invention is not limited thereto. The protective layer 160 may have, for example, high surface hardness. For example, the protective layer 160 may be a hard coating with pencil hardness greater than 5 H, so as to protect the surface 121 of the flexible layer 120 from being scratched or damaged. In addition, the protective layer 160 may have, for example, a function such as anti-glare or reducing a chromatic aberration value. For example, the protective layer 160 may further include, for example, a plurality of anti-glare structures or optical matching layers. The anti-glare structure may be, for example, used for enabling incident ambient light to generate sufficient scattering, so as to prevent most of the ambient light from being incident onto a display panel to affect an image display effect of the display panel, and further provide an anti-glare capability. In addition, the optical matching layer may include, for example, a plurality of films having different refractive indexes, and may be used for avoiding a problem that the component layer 130 interferes image display of the display panel when an electronic device is illuminated by the ambient light.

At this point, fabrication of the flexible panel 100a in the invention is completed. It should be noted that in some embodiments, after the steps in FIG. 1G are performed, the functional layer 150 is removed to complete the fabrication of the flexible panel 100a, but the invention is not limited thereto. For example, when the functional layer 150 is an ultraviolet (UV) film, the function layer 150 may be irradiated with an ultraviolet light to decrease the adhesive force between the functional layer 150 and the component layer 130, such that the functional layer is peeled off from the component layer 130 more easily.

Although the method for manufacturing the flexible panel 100a in the present embodiment is described with reference to the foregoing method as an example, a method for forming the flexible panel 100a in the invention is not limited thereto.

FIG. 2 is a schematic top view of the flexible panel according to the present embodiment, and FIG. 1G is a schematic cross-sectional view taken along line A-A' in FIG. 2. To make the accompanying drawing clear, FIG. 2 mainly shows contours of the component layer 130, the light shielding layer 140, and the through hole 120a, and contours of other components are omitted. A flexible layer 120 has the through hole 120a, and the through hole 120a may be, for example, used for placing camera device therein. The component layer 130 may be, for example, a touch component layer or a display component layer. In the present embodiment, the component layer 130 is a touch component layer. In a conventional flexible touch panel, a touch component layer is formed on a flexible layer, and a cover lens (for example, a glass cover lens or a plastic cover lens) is laminated to the touch component layer through an optical clear adhesive. However, in the present embodiment, the protective layer 160 and the component layer 130 are respectively formed on the surfaces 121 and 122 respectively on two opposite sides of the flexible layer 120. Replacing a conventional cover lens with the protective layer 160 and omitting the optical clear adhesive in the present embodiment can reduce the thickness and the manufacturing costs of the flexible touch panel. Therefore, the flexible panel 100a in the present embodiment may also be referred to as One Plastic Solution (OPS).

Figure 3A:
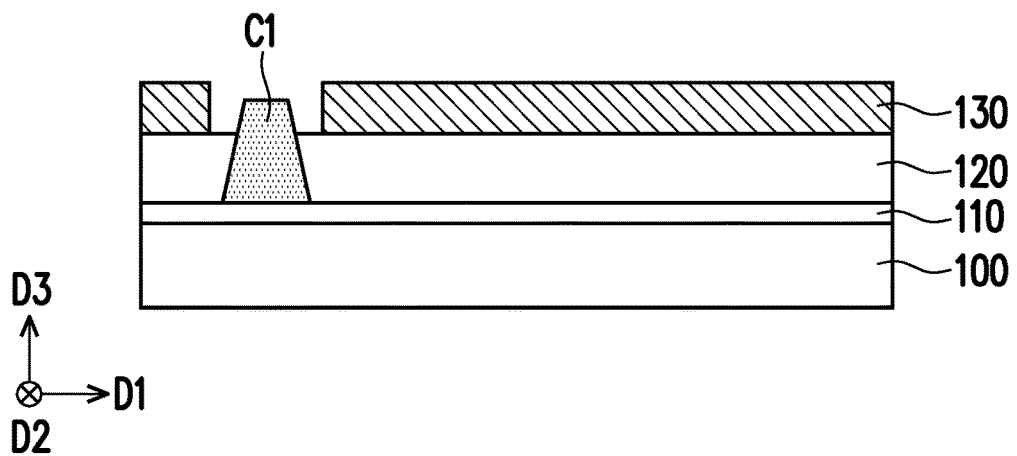
FIG. 3A to FIG. 3C schematically illustrate some steps of manufacturing a flexible panel according to a second embodiment of the invention.
Figure 3B:
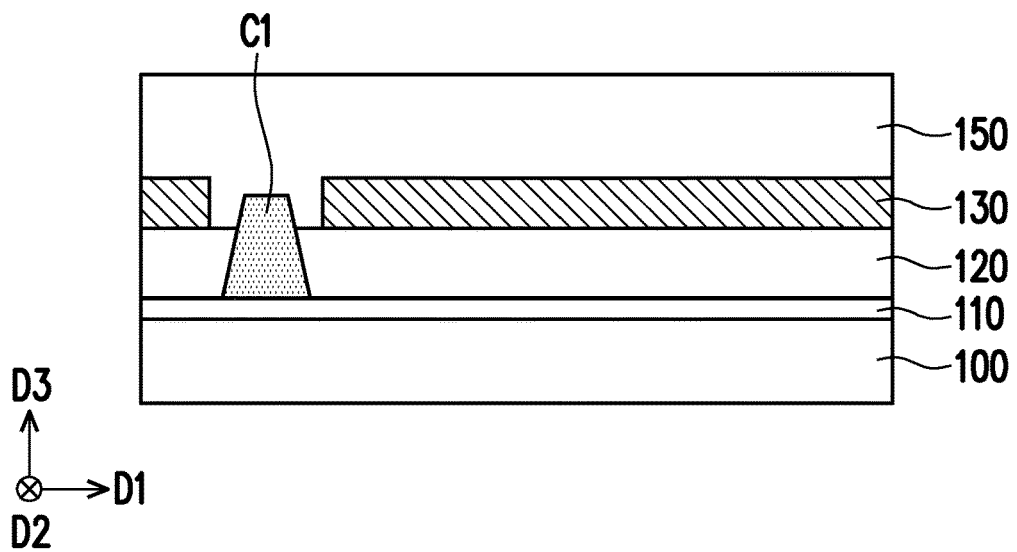
Figure 3C:
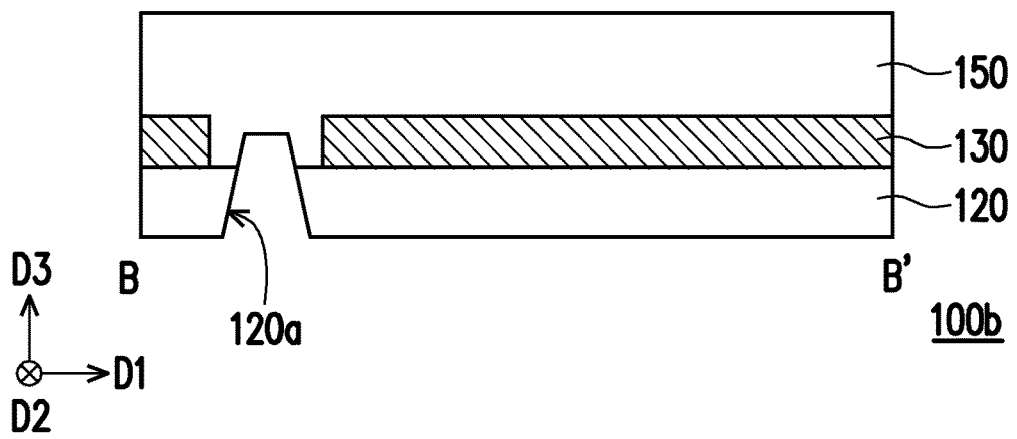
Figure 4:
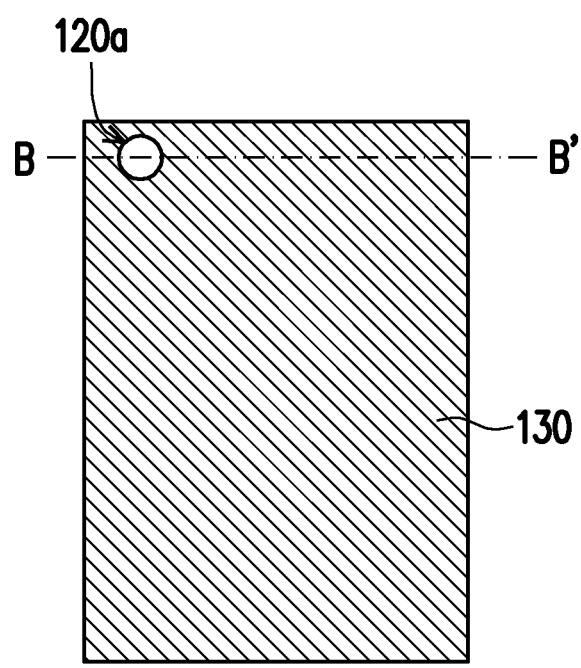
FIG. 4 is a schematic top view of the flexible panel according to the second embodiment of the invention.

FIG. 3A to FIG. 3C schematically illustrate some steps of manufacturing a flexible panel according to a second embodiment of the invention, and FIG. 4 is a schematic top view of the flexible panel according to the second embodiment of the invention. In the embodiments depicted in FIG. 3A to FIG. 3C and FIG. 4, the component reference numbers and partial content of the embodiment in FIG. 1A to FIG. 1G and FIG. 2 are also applicable. The same or similar reference numbers are used for representing same or similar components, and descriptions of same technical content are omitted. For descriptions of the omitted parts, reference may be made to the descriptions and effects of the foregoing embodiments. The descriptions thereof are omitted in the following embodiments. For at least a part of descriptions that is not omitted in the embodiment in FIG. 3A to FIG. 3C, reference may be made to the subsequent content. In addition, FIG. 3A continues process steps after those in FIG. 1C, which is pre-specified herein.

Referring to FIG. 3A, after the process steps in FIG. 1A to 1C are performed, a component layer 130 is formed on a flexible layer 120. In the present embodiment, a flexible panel is a flexible display panel, and the component layer 130 is a display component layer. The component layer 130 in the present embodiment may include, for example, a plurality of scanning lines (not shown), a plurality of data lines (not shown), a plurality of transistors (not shown), and a plurality of electrodes (not shown). In some embodiments, the component layer 130 may further include a display medium (not shown). When the component layer 130 includes a non-self-illuminating display medium, a non-self-illuminating material included in the component layer 130 is, for example, liquid crystal molecules, an electrophoretic display medium, or another applicable display medium, but the invention is not limited thereto. In some other embodiments, the component layer 130 may include a self-illuminating display medium. For example, the component layer 130 may include a light emitting diode. In addition, the component layer 130 may further include a light conversion structure (not shown). The light conversion structure may convert an incident light into a light with different color. The light conversion structure may include a color filter, a phosphor layer, or a quantum dot layer in the present embodiment, but the invention is not limited thereto. For example, the light conversion structure may include a color filter which converts a white light into a light with one of the three-primary colors (namely, red, green, and blue), but the invention is not limited thereto. In other embodiments, the light conversion structure may include a phosphor layer or a quantum dot layer which converts an incident light (for example, a blue light) into a light with a different wavelength (for example, a red light, a yellow light, or a green light), but the invention is not limited thereto.

Referring to FIG. 3B, a functional layer 150 is disposed on the component layer 130. For a method for disposing the functional layer 150 on the component layer 130 and a material of the functional layer 150, reference may be made to the foregoing embodiments. The descriptions thereof are omitted herein.

Referring to FIG. 3C, a carrier substrate 100, a release layer 110, and a column C1 are removed. For a method for removing the carrier substrate 100, the release layer 110, and the column C1, reference may be made to the foregoing embodiments. The descriptions thereof are omitted herein.

At this point, manufacturing for a flexible panel 100b in the invention is completed. It should be noted that in some embodiments, after the steps in FIG. 3C are performed, the functional layer 150 is removed to complete the fabrication of the flexible panel 100b, but the invention is not limited thereto.

Although the method for manufacturing the flexible panel 100b in the present embodiment is described with reference to the foregoing method as an example, a method for forming the flexible panel 100b in the invention is not limited thereto.

FIG. 3C is a schematic top view of the flexible panel according to the present embodiment, and FIG. 3C is a schematic cross-sectional view taken along line B-B' in FIG.

4. To make the accompanying drawing clear, FIG. 4 mainly shows contours of the component layer 130 and the through hole 120a, and contours of other components are omitted.

In the present embodiment, the flexible panel 100b is a flexible display panel, and does not have the light shielding layer 140 and the protective layer 160 in the first embodiment, but the invention is not limited thereto. Generally, in an electronic device of a flexible touch display panel, a flexible touch panel is usually disposed on the flexible display panel, and the flexible touch panel faces a user. Therefore, a protective layer 160 needs to be disposed on the surface 121 of the flexible layer 120 in the flexible touch panel, for example, the flexible panel 100a in the first embodiment, so as to prevent the flexible layer 120 of the flexible touch panel from being damaged or scratched by the external environment or the user. In addition, the flexible touch panel, for example, the flexible panel 100a in the first embodiment, has a light shielding layer 140 disposed in a peripheral region. Therefore, the peripheral region of the flexible touch display panel may have a light shielding layer without further disposing a light shielding layer on the flexible display panel, for example, the flexible panel 100a in the second embodiment, but the invention is not limited thereto. For example, in some embodiments, the flexible display panel has a light shielding layer disposed in the peripheral region and/or a protective layer disposed on a surface of the flexible layer.

Figure 5A:
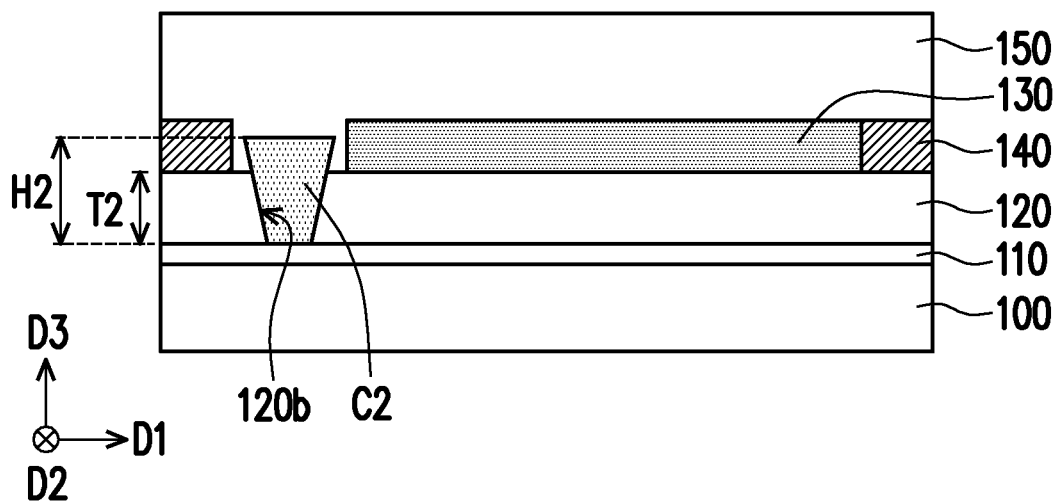
FIG. 5A to FIG. 5C schematically illustrate some steps of manufacturing a flexible panel according to a first variation of the first embodiment of the invention.
Figure 5B:
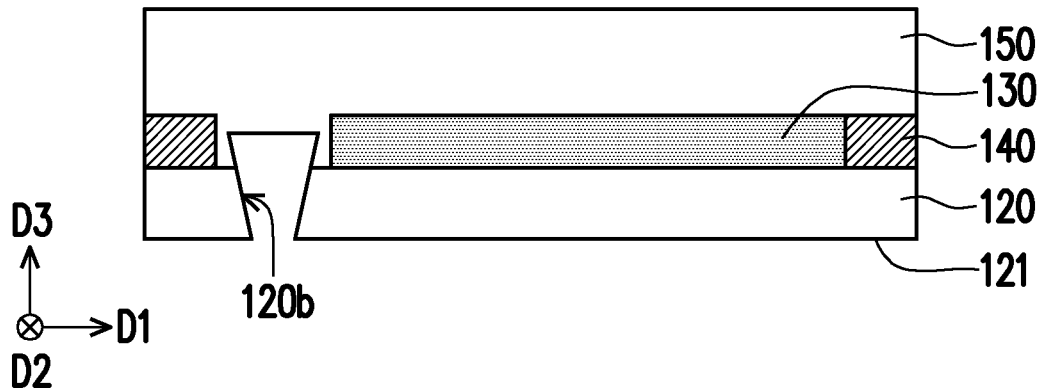
Figure 5C:
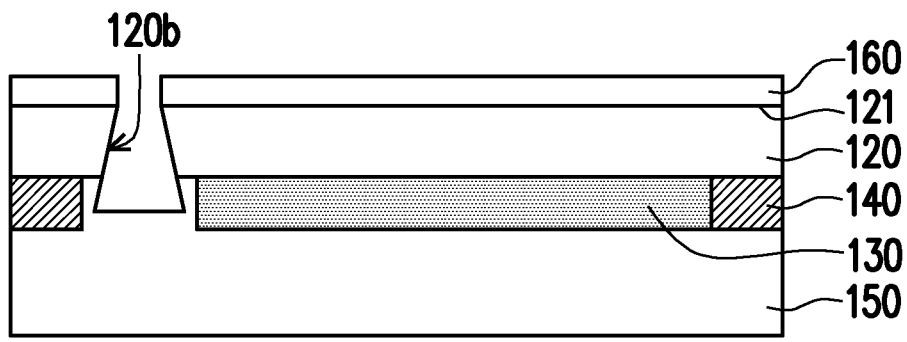

FIG. 5A to FIG. 5C schematically illustrate some steps of manufacturing a flexible panel according to a first variation of the first embodiment of the invention. In the embodiment depicted in FIG. 5A to FIG. 5C, the component reference numbers and partial content of the embodiment in FIG. 1E to FIG. 1G are also applicable. The same or similar reference numbers are used for representing same or similar components, and descriptions of same technical content are omitted. For descriptions of the omitted parts, reference may be made to the descriptions and effects of the foregoing embodiments. The descriptions thereof are omitted in the following embodiments. For at least a part of descriptions that is not omitted in the embodiment in FIG. 5A to FIG. 5C, reference may be made to the subsequent content.

Referring to FIG. 5A, a main difference between the present embodiment and the embodiment described in FIG. 1E lies in that: a cross-sectional area of a column C2 in the present embodiment increases in a normal direction away from the carrier substrate 100. That is, the cross-sectional area of the column C2 on a plane D1-D2 increases in the normal direction D3 away from the carrier substrate 100. For example, the column C2 may be inverted-cone-shaped, but the invention is not limited thereto. It should be noted that cross-sectional areas of the column C1 in the first and the second embodiment and the column C2 in this variation embodiment on the plane D1-D2 respectively decreases and increases in the direction D3. Therefore, when the column C1 and the column C2 are formed by using a photoresist material through an exposure and developing process, positive photoresist may be selected to form, through the exposure and developing process, the column C1 whose cross-sectional area on the plane D1-D2 decreases in the direction D3, and negative-type photoresist may be selected to form, through the exposure and developing process, the column C2 whose cross-sectional area on the plane D1-D2 increases in the direction D3, but the invention is not limited thereto. In the present embodiment, a thickness T2 of the flexible layer 120 is less than a height H2 of the column C2, and preferably, a difference between the thickness T2 of the flexible layer 120 and the height H2 of the column C2 is 1 micrometer to 10 micrometers, but the invention is not limited thereto. In other embodiments, the thickness T2 of the flexible layer 120 may be equal to the height H2 of the column C2 and the column C2 is surrounded by the flexible layer 120, so that the column C2 may also penetrate the flexible layer 120 to form a through hole 120b in the flexible layer 120. In addition, the component layer 130 in the present embodiment is not limited to be a touch component layer, and may be a display component layer, which is specified herein.

Referring to FIG. 5B, a carrier substrate 100, a release layer 110, and a column C2 are removed. A method for removing the carrier substrate 100, the release layer 110, and the column C2 is the same as or similar to that in the first embodiment. The descriptions thereof are omitted herein. In the present embodiment, the cross-sectional area of the column C2 on the plane D1-D2 increases in the direction D3, and a cross-sectional area, on the plane D1-D2, of the through hole 120b increases in the direction D3.

Referring to FIG. 5C, a protective layer 160 is disposed on the surface 121 of the flexible layer 120. A material, a structure, and features of the protective layer 160 are the same as or similar to those in the first embodiment. The descriptions thereof are omitted herein.

At this point, manufacturing for a flexible panel 100c in the invention is completed.

Although the method for manufacturing the flexible panel 100c in the present embodiment is described with reference to the foregoing method as an example, a method for forming the flexible panel 100c in the invention is not limited thereto.

Figure 6A:
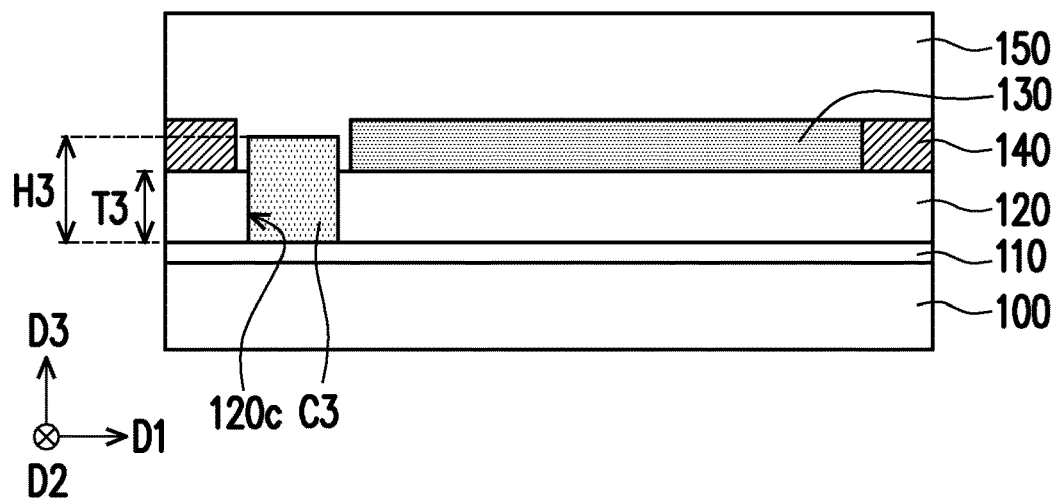
FIG. 6A to FIG. 6C schematically illustrate some steps of manufacturing a flexible panel according to a second variation of the first embodiment of the invention.
Figure 6B:
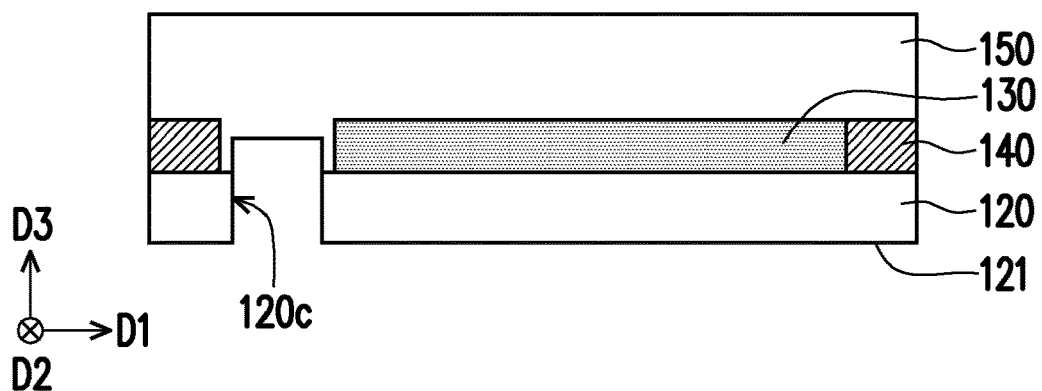
Figure 6C:
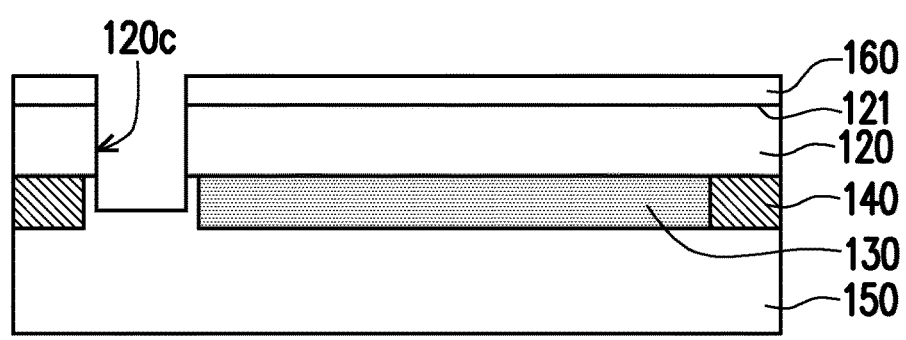

FIG. 6A to FIG. 6C schematically illustrate some steps of manufacturing a flexible panel according to a second variation of the first embodiment of the invention. In the embodiment depicted in FIG. 6A to FIG. 6C, the component reference numbers and partial content of the embodiment in FIG. 1E to FIG. 1G are also applicable. The same or similar reference numbers are used for representing same or similar components, and descriptions of same technical content are omitted. For descriptions of the omitted parts, reference may be made to the descriptions and effects of the foregoing embodiments. The descriptions thereof are omitted in the following embodiments. For at least a part of descriptions that is not omitted in the embodiment in FIG. 6A to FIG. 6C, reference may be made to the subsequent content.

Referring to FIG. 6A, a main difference between the present embodiment and the embodiment described in FIG. 1E lies in that: a cross-sectional area of a column C3 in the present embodiment keeps unchanged in a normal direction away from the carrier substrate 100. That is, the cross-sectional area of the column C3 on a plane D1-D2 keeps unchanged in the direction D3. For example, the column C3 may have a shape similar to a cylinder or a square column, but the invention is not limited thereto. In the present embodiment, a thickness T3 of the flexible layer 120 is less than a height H3 of the column C3, and preferably, a difference between the thickness T3 of the flexible layer 120 and the height H3 of the column C3 is 1 micrometer to 10 micrometers, but the invention is not limited thereto. In other embodiments, the thickness T3 of the flexible layer 120 may be equal to the height H3 of the column C3 and the column C3 is surrounded by the flexible layer 120, so that the column C3 may also penetrate the flexible layer 120 to form a through hole 120c in the flexible layer 120. In addition, the component layer 130 in the present embodiment is not limited to be a touch component layer, and may be a display component layer, which is specified herein.

Referring to FIG. 6B, a carrier substrate 100, a release layer 110, and a column C3 are removed. A method for removing the carrier substrate 100, the release layer 110, and the column C3 is the same as or similar to that in the first embodiment. The descriptions thereof are omitted herein. In the present embodiment, because the cross-sectional area of the column C3 on the plane D1-D2 essentially keeps unchanged in the direction D3, a cross-sectional area, on the plane D1-D2, of the through hole 120c essentially keeps unchanged in the direction D3.

Referring to FIG. 6C, a protective layer 160 is disposed on the surface 121 of the flexible layer 120. A material, a structure, and features of the protective layer 160 are the same as or similar to those in the first embodiment. The descriptions thereof are omitted herein.

At this point, manufacturing for a flexible panel 100d in the invention is completed.

Although the method for manufacturing the flexible panel 100d in the present embodiment is described with reference to the foregoing method as an example, a method for forming the flexible panel 100d in the invention is not limited thereto.

In addition, the first variation embodiment and the second variation embodiment of the first embodiment may also be applied to the second embodiment. That is, the column C2 in FIG. 3A to FIG. 3C may be replaced by a column whose cross-sectional area on the plane D1-D2 increases or essentially keeps unchanged in the direction D3, and the through hole 120a may be replaced by a through hole whose cross-sectional area on the plane D1-D2 increases or essentially keeps unchanged in the direction D3. The descriptions thereof are omitted herein.

Figure 7A:
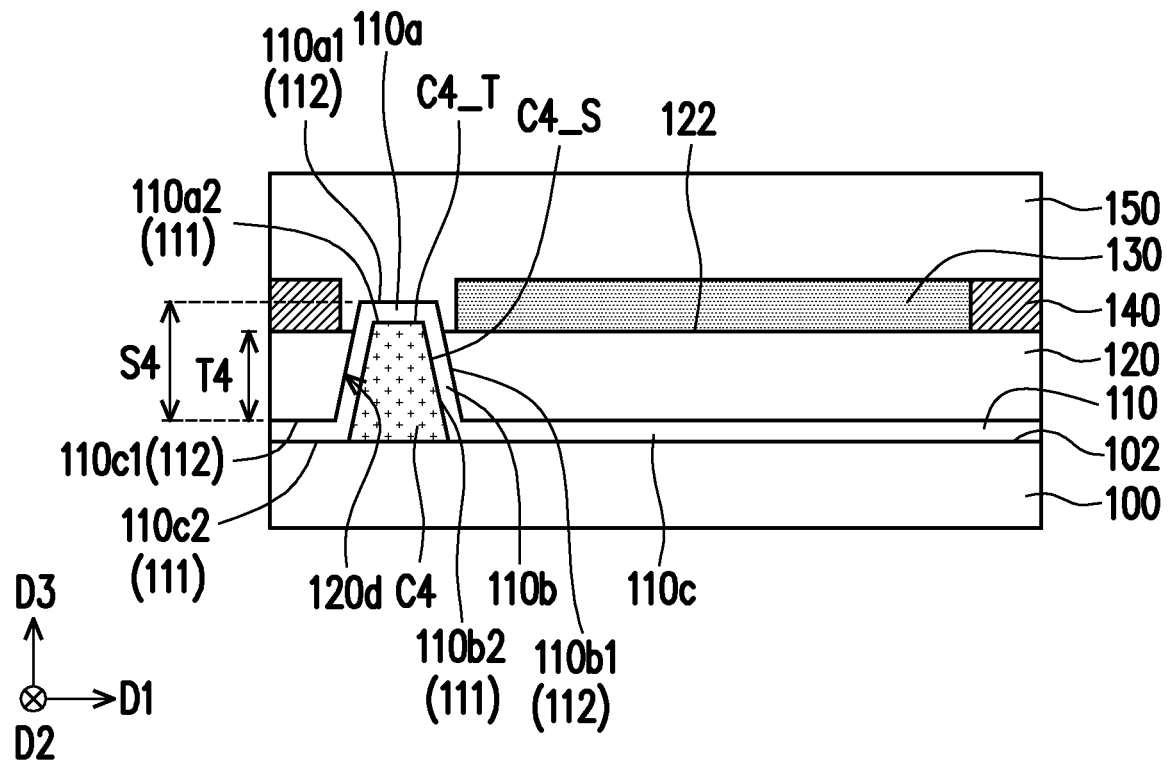
FIG. 7A to FIG. 7B schematically illustrate some steps of manufacturing a flexible panel according to a third embodiment of the invention.
Figure 7B:
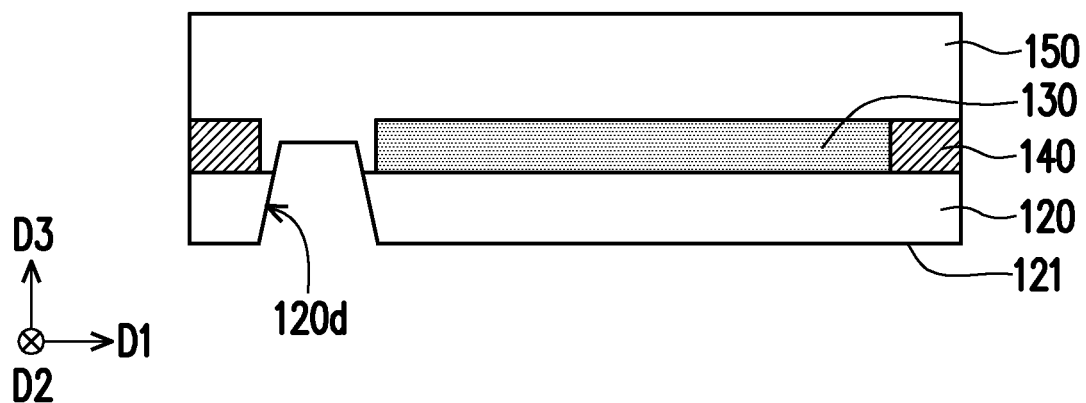

FIG. 7A to FIG. 7B schematically illustrate some steps of manufacturing a flexible panel according to a third embodiment of the invention. In the embodiment depicted in FIG. 7A and FIG. 7B, the component reference numbers and partial content of the embodiment in FIG. 1E and FIG. 1F are also applicable. The same or similar reference numbers are used for representing same or similar components, and descriptions of same technical content are omitted. For descriptions of the omitted parts, reference may be made to the descriptions and effects of the foregoing embodiments. The descriptions thereof are omitted in the following embodiments. For at least a part of descriptions that is not omitted in the embodiment in FIG. 7A and FIG. 7B, reference may be made to the subsequent content. It is pre-specified herein that FIG. 7A and FIG. 7B show another method for manufacturing the flexible panel 100a.

Referring to FIG. 7A, a main difference between the present embodiment and the embodiment described in FIG. 1E lies in that: the release layer 110 in the present embodiment covers a column C4. In other words, the column C4 has been formed on a surface of the carrier substrate 100 before the release layer 110 is formed, and is then covered by the release layer 110. For example, the column C4 is formed on the carrier substrate 100, next, the release layer 110 is formed on the column C4 and the carrier substrate 100, and the release layer 110 covers a top surface C4_T and a side surface C4_S of the column C4. As shown in FIG. 7A, the release layer 110 includes a first part 110a, a second part 110b, and a third part 110c. The first part 110a covers the top surface C4_T of the column C4 and has two opposite surfaces 110a1 and 110a2. The surface 110a2 and the top surface C4_T of the column C4 are opposite to each other. The second part 110b is located on a side edge of the side surface C4_S of the column C4 and has two opposite surfaces 110b1 and 110b2. The surface 110b2 and the side surface C4_S of the column C4 are opposite to each other. The third part 110c covers and is in contact with the carrier substrate 100, and has two opposite surfaces 110c1 and 110c2. The surface 110c2 and a surface 102 of the carrier substrate 100 are opposite to each other. The side surface C4_S of the column C4 and the second part 110b of the release layer 110 are surrounded by the flexible layer 120, and the column C4 and a part (the second part 110b) of the release layer 110 penetrate the flexible layer 120. Therefore, a through hole 120d may be formed in the flexible layer 120. That is, a region occupied by the column C4 and the second part 110b of the release layer 110 in the flexible layer 120 is the through hole 120d of the flexible layer 120. Compared with the first embodiment, the flexible layer 120 in the first embodiment is in contact with a part of the side surface C1_S of the column C1 and the release layer 110, therefore, materials that are easy to be peeled off from the flexible layer 120 in a lift-off process need to be selected for the column C1 and the release layer 110. However, the flexible layer 120 in the present embodiment is in contact with the release layer 110, but is not in contact with the column C4. Therefore, for the release layer 110 in the present embodiment, a material that is easy to be peeled off from the flexible layer 120 in a lift-off process needs to be selected. For example, the material of the release layer 110 may be an organic material including silicon, an organic material including fluorine, an inorganic material including silicon dioxide, or a combination of the materials described above, but the invention is not limited thereto. In the present embodiment, for the column C4, a high-temperature-resistant material, for example, a high-temperature-resistant photoresist material, may be selected, but the invention is not limited thereto. In addition, a cross-sectional area of the column C4 decreases in a normal direction away from the carrier substrate 100. That is, a projection of the column C4 on a plane D1-D3 may have a shape similar to a regular trapezoid. Based on this, the material of the column C4 may be, for example, positive photoresist, but the invention is not limited thereto. In the present embodiment, the cross-sectional area of the column C4 on the plane D1-D2 decreases in the direction D3, and a cross-sectional area, on the plane D1-D2, of the through hole 120d decreases in the direction D3. In addition, in the present embodiment, the surface 110c2 of the third part 110c of the release layer 110 is in contact with the carrier substrate 100, the surface 110a1 of the first part 110a of the release layer 110 located on the top surface C4_T of the column C4 is higher than a surface 122 of the flexible layer 120 in the direction D3, and a difference therebetween is preferably 1 micrometer to 10 micrometers. The surface 110a1 of the first part 110a of the release layer 110 located on the top surface C4_T of the column C4 may be also called as the top surface 110a1 of the release layer 110 located above a top surface C4_T of the column C4, and the surface 122 of the flexible layer 120 may be also called as the top surface 122 of the flexible layer 120. For example, as shown in FIG. 7A, the release layer 110 has two opposite surfaces 111 and 112. The surface 111 of the release layer 110 includes surfaces 110a2, 110b2, and 110c2, and the surface 112 of the release layer 110 includes surfaces 110a1, 110b1, and 110c1. The release layer 110 covers the column C4, so that the surface 112 of the release layer 110 has a height difference (a difference between the surface 110a1 and the surface 110c1 in the direction D3) S4. The flexible layer 120 has a thickness T4. The thickness T4 of the flexible layer 120 is less than the height difference S4 of the surface 112 of the release layer 110, and a difference therebetween is preferably 1 micrometer to 10 micrometers, that is, 1 micrometer$\leq$S4−T4$\leq$10 micrometers, but the invention is not limited thereto. In other embodiments, a height of the surface 110a1 of the first part 110a of the release layer 110 located on the top surface C4_T of the column C4 is the same as that of the surface 122 of the flexible layer 120 in the direction D3. That is, the thickness T4 of the flexible layer 120 is equal to the height difference S4 of the surface of the release layer 110, and the column C4 and a part (the first part 110a and the second part 110b) of the release layer 110 penetrate the flexible layer 120. In this way, the through hole 120d may also be formed in the flexible layer 120. That is, a region occupied by the column C4 and the first part 110a and the second part 110b of the release layer 110 in the flexible layer 120 is the through hole 120d of the flexible layer 120. Based on the above, the thickness T4 of the flexible layer 120 is less than or equal to the height difference S4 of the surface of the release layer 110, so that the column C4 and the part of the release layer 110 may penetrate the flexible layer 120 to form the through hole 120d in the flexible layer 120. Therefore, a height of a top surface 110a1 of the release layer 110 located above a top surface C4_T of the column C4 is equal to or higher than a height of a top surface 122 of the flexible layer 120 in a direction D3 perpendicular to the carrier substrate 110 in the invention. The height of the top surface 110a1 of the release layer 110 is preferably higher than the height of the top surface 122 of the flexible layer 120, and the difference therebetween is preferably greater than or equal to 1 micrometer and less than or equal to 10 micrometers. In addition, the column C4 and a part of the release layer 110 penetrate the flexible layer 120, and a region of flexible layer 120 penetrated by the column C4 and the part of the release layer 110 is the through hole 120d in the invention.

Referring to FIG. 7B, a carrier substrate 100, a release layer 110, and a column C4 are removed. A method for removing the carrier substrate 100, the release layer 110, and the column C4 is the same as or similar to that in the first embodiment. The descriptions thereof are omitted herein. Subsequently, similar to FIG. 1G, a protective layer may be disposed on the surface 121 of the flexible layer 120. This is not specifically limited in the invention.

Figure 8A:
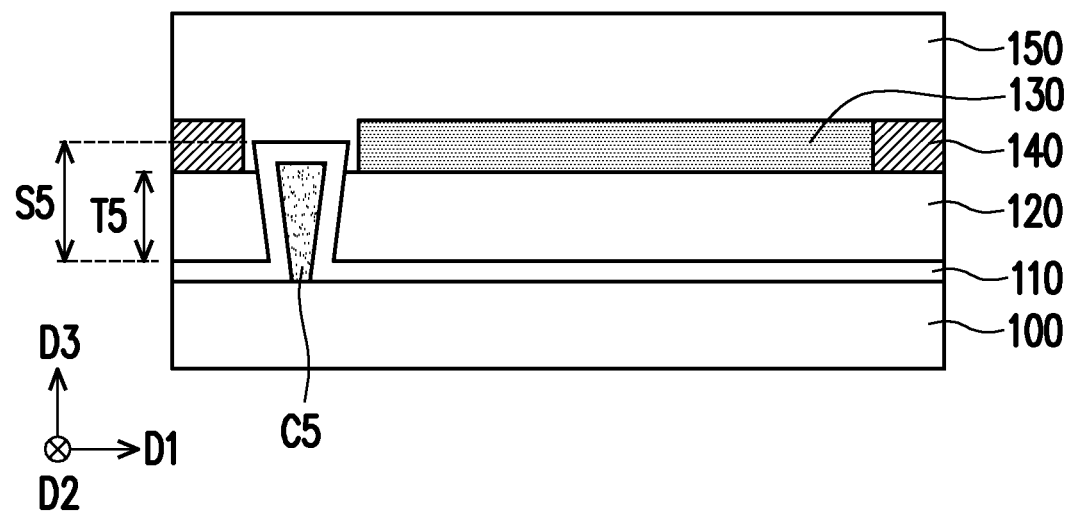
FIG. 8A to FIG. 8B schematically illustrate some steps of manufacturing a flexible panel according to a variation of the third embodiment of the invention.
Figure 8B:
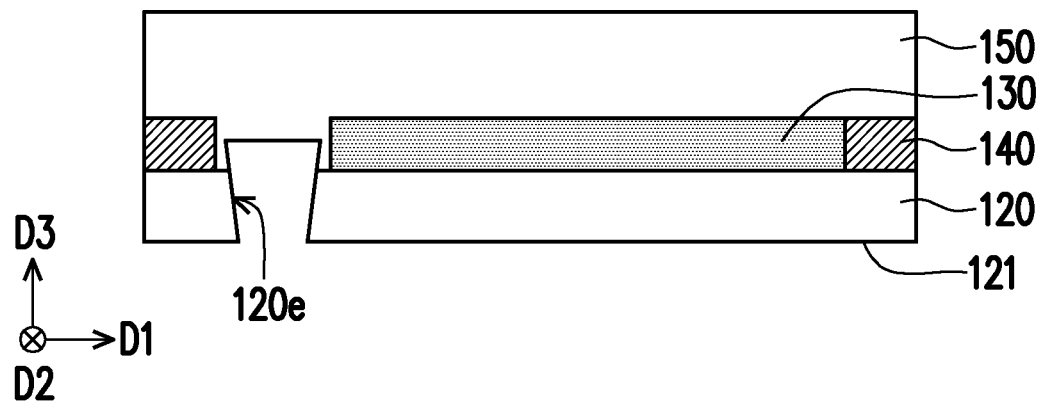

FIG. 8A to FIG. 8B schematically illustrate some steps of manufacturing a flexible panel according to a variation of the third embodiment of the invention. In the embodiment depicted in FIG. 8A and FIG. 8B, the component reference numbers and partial content of the embodiment in FIG. 7A and FIG. 7B are also applicable. The same or similar reference numbers are used for representing same or similar components, and descriptions of same technical content are omitted. For descriptions of the omitted parts, reference may be made to the descriptions and effects of the foregoing embodiments. The descriptions thereof are omitted in the following embodiments. For at least a part of descriptions that is not omitted in the embodiment in FIG. 8A and FIG. 8B, reference may be made to the subsequent content. It is pre-specified herein that FIG. 8A and FIG. 8B show another method for manufacturing the flexible panel 100c.

Referring to FIG. 8A, a main difference between the present embodiment and the embodiment described in FIG. 7A lies in that: a cross-sectional area of a column C5 in the present embodiment decreases in a normal direction away from the carrier substrate 100. That is, a projection of the column C5 on a plane D1-D3 may have a shape similar to an inverted trapezoid. Based on this, the material of the column C5 may be, for example, negative photoresist, but the invention is not limited thereto. In the present embodiment, the cross-sectional area of the column C5 on the plane D1-D2 increases in the direction D3, so that a cross-sectional area, on the plane D1-D2, of a through hole 120e increases in the direction D3. For other parts and a relationship between a height difference S5 of a surface of the release layer 110 and a thickness T5 of the flexible layer 120 in FIG. 8A, reference may be made to the third embodiment. The descriptions thereof are omitted herein. For example, for the relationship between the height difference S5 of the surface of the release layer 110 and the thickness T5 of the flexible layer 120 in FIG. 8A, reference may be made to the relationship between the height difference S4 of the surface of the release layer 110 and the thickness T4 of the flexible layer 120 in the third embodiment.

Referring to FIG. 8B, a carrier substrate 100, a release layer 110, and a column C5 are removed. A method for removing the carrier substrate 100, the release layer 110, and the column C5 is the same as or similar to that in the first embodiment. The descriptions thereof are omitted herein. Subsequently, similar to FIG. 1G, a protective layer may be disposed on the surface 121 of the flexible layer 120. This is not specifically limited in the invention.

It should be noted that the method in the second variation embodiment of the first embodiment may also be applied to the third embodiment. That is, the column C4 in FIG. 7A and FIG. 7B may change into a column whose cross-sectional area on the plane D1-D2 essentially keeps unchanged in the direction D3, and the through hole 120d may change into a through hole whose cross-sectional area on the plane D1-D2 essentially keeps unchanged in the direction D3. The descriptions thereof are omitted herein. In addition, similar to the first embodiment and the second embodiment, the method, in the third embodiment or the variation embodiment of the third embodiment, in which a release layer covers a column, and a cross-sectional area of the column on a plane D1-D2 decreases, increases, or essentially keeps unchanged in a direction D3 may also be applied to form a flexible panel similar to the flexible panel in the second embodiment, for example, a flexible display panel. The descriptions thereof are omitted herein.

To sum up, the through hole of the flexible layer in the flexible panel as provided in one or more embodiments of the invention is formed through the following steps: first forming a column before forming the flexible layer, so that the flexible layer may surround the column, and then removing the column to form a through hole having a shape similar to the column. No chars and cracks are formed on the resultant through hole, and the resultant through hole has a smooth cross section.

Finally, it should be noted that the foregoing embodiments are used for describing the technical solutions of the invention, but are not intended to limit the invention. Although the invention is described in detail with reference to the foregoing embodiments, a person of ordinary skill in the art should understand that, modifications may still be made to the technical solutions in the foregoing embodiments, or equivalent replacements may be made to some or all of the technical features; and such modifications or replacements will not cause the essence of corresponding technical solutions to depart from the scope of the technical solutions in the embodiments of the invention. The features of the embodiments may be used in any combination without departing from the spirit of the invention or conflicting with each other.

What is claimed is:

1. A method for manufacturing a flexible panel, the method comprising steps of:
   forming a column on a carrier substrate;

forming a flexible layer on the carrier substrate, wherein at least a part of a side surface of the column is surrounded by the flexible layer, and a through hole is formed in the flexible layer;

forming a component layer on the flexible layer; and removing the column and the carrier substrate, wherein before the step of forming the flexible layer on the carrier substrate, the method further comprises a step of forming a release layer on the carrier substrate, the step of forming the release layer on the carrier substrate is performed before the step of forming the column on the carrier substrate, and the column is located on the release layer after the step of forming the column on the carrier substrate is performed.

2. The method for manufacturing the flexible panel according to claim 1, wherein the column penetrates the flexible layer after the step of forming the flexible layer on the carrier substrate is performed.

3. The method for manufacturing the flexible panel according to claim 2, wherein a region of flexible layer penetrated by the column is the through hole.

4. The method for manufacturing the flexible panel according to claim 2, wherein a height of the column is greater than or equal to a height of the flexible layer in a direction perpendicular to the carrier substrate.

5. The method for manufacturing the flexible panel according to claim 4, wherein the height of the column is greater than the height of the flexible layer, and the difference between the height of the column and the height of the flexible layer is greater than or equal to 1 micrometer and less than or equal to 10 micrometers.

6. The method for manufacturing the flexible panel according to claim 1, wherein the step of removing the column and the carrier substrate further comprises removing the release layer.

7. The method for manufacturing the flexible panel according to claim 1, wherein the step of forming the flexible layer on the carrier substrate comprises:

forming a flexible material layer on the carrier substrate; and performing a heat treatment process on the flexible material layer.

8. The method for manufacturing the flexible panel according to claim 1, wherein the component layer comprises a touch component layer or a display component layer.

9. The method for manufacturing the flexible panel according to claim 1, wherein the flexible layer has a first surface and a second surface opposite to each other, the second surface is in contact with the component layer, and after the step of removing the column and the carrier substrate, the method further comprises a step of forming a protective layer on the first surface of the flexible layer.

10. A method for manufacturing a flexible panel, the method comprising steps of:

forming a column on a carrier substrate;

forming a flexible layer on the carrier substrate, wherein at least a part of a side surface of the column is surrounded by the flexible layer, and a through hole is formed in the flexible layer;

forming a component layer on the flexible layer; and removing the column and the carrier substrate wherein the method further comprises a step of forming a release layer on the carrier substrate, the step of forming the release layer on the carrier substrate is performed after the step of forming the column on the carrier substrate and before the step of forming the flexible layer on the carrier substrate, and the release layer covers the column after the step of forming the release layer on the carrier substrate is performed.

11. The method for manufacturing the flexible panel according to claim 10, wherein the column and a part of the release layer penetrate the flexible layer after the step of forming the flexible layer on the carrier substrate is performed.

12. The method for manufacturing the flexible panel according to claim 11, wherein a region of flexible layer penetrated by the column and the part of the release layer is the through hole.

13. The method for manufacturing the flexible panel according to claim 11, wherein a height of a top surface of the release layer located above a top surface of the column is equal to or higher than a height of a top surface of the flexible layer in a direction perpendicular to the carrier substrate.

14. The method for manufacturing the flexible panel according to claim 13, the height of the top surface of the release layer is higher than the height of the top surface of the flexible layer, and the difference between e height of the top surface of the release lave and the height of the top surface of the flexible layer is greater than or equal to 1 micrometer and less than or equal to 10 micrometers.

15. The method for manufacturing the flexible panel according to claim 10, wherein a material of the column includes photoresist.

16. The method for manufacturing the flexible panel according to claim 10, wherein the component layer comprises a touch component layer or a display component layer.

17. A method for manufacturing a flexible panel, the method comprising steps of:

forming a column on a carrier substrate;

forming a flexible layer on the carrier substrate, wherein at least a part of a side surface of the column is surrounded by the flexible layer, and a through hole is formed in the flexible layer;

forming a component layer on the flexible layer; and removing the column and the carrier substrate the method further comprises a step of forming a release layer on the carrier substrate and a step of forming a functional layer on the component layer, wherein the step of forming the release layer on the carrier substrate is performed before the step of forming the flexible layer on the carrier substrate, the step of forming the functional layer on the component layer is performed after the step of forming the component layer on the flexible layer and before the step of removing the column and the carrier substrate, and an adhesive force between the functional layer and the component layer is greater than an adhesive force between the flexible layer and the release layer.

18. The method for manufacturing the flexible panel according to claim 17, wherein the functional layer a protective film or an ultraviolet (UV) film.

* * * * *